United States Patent [19]
Gross, Jr.

[11] Patent Number: 6,157,338
[45] Date of Patent: Dec. 5, 2000

[54] DETERMINISTIC SUCCESSIVE APPROXIMATION ANALOG-TO-DIGITAL CONVERTER

[75] Inventor: George Francis Gross, Jr., Fleetwood, Pa.

[73] Assignee: Lucent Technologies Inc., Murray Hill, N.J.

[21] Appl. No.: 09/255,988

[22] Filed: Feb. 23, 1999

[51] Int. Cl.[7] .................................................. H03M 1/50
[52] U.S. Cl. .......................................... 341/161; 341/165
[58] Field of Search .................................. 341/161, 162, 341/163, 155, 165

[56] References Cited

U.S. PATENT DOCUMENTS 5,272,481  12/1993  Sauer ....................................... 341/165
5,760,730   6/1998  Fisher et al. ............................. 341/161
6,020,840   2/2000  Ong ......................................... 341/155

*Primary Examiner*—Michael Tokar
*Assistant Examiner*—Jean B. Jeanglaude
*Attorney, Agent, or Firm*—David L. Smith

[57] ABSTRACT

An integrated circuit which includes a successive approximation analog-to-digital converter. The successive approximation analog-to-digital converter employs oppositely coupled comparators and logic circuitry to generate a signal upon a bit determination, with the signal latching the determined bit, resetting the comparators for the subsequent bit determination, and if additional bit(s) are to be determined, commencing the subsequent bit determination. The converter may be configured as a single ended, differential or complimentary circuit.

13 Claims, 2 Drawing Sheets

DETERMINISTIC SUCCESSIVE APPROXIMATION ANALOG-TO-DIGITAL CONVERTER

TECHNICAL FIELD

This application relates to analog-to-digital converters and more particularly to achieving greater speed of conversion in successive approximation converters.

BACKGROUND OF THE INVENTION

Analog-to-digital converters (ADCs) are used to convert an analog signal, more precisely a series of samples of an analog signal, to a series of digitally coded signals. ADCs span a spectrum of designs that range from parallel flash-type converters employing multiple comparators that generally require a single clock cycle to determine all bits of resolution at one end of the spectrum, to a successive approximation-type converter that generally requires one clock cycle per bit of resolution at the other end of the spectrum. In order to achieve a high speed rate of conversion with little latency, a large number of comparators are employed in a flash converter. While flash converters achieve a fast conversion, they consume relatively large amounts of area on integrated circuits and relatively large amounts of power.

Successive approximation converters consume relatively less area on integrated circuits and relatively less power than flash converters, but introduce latency in converting an analog sample to a digitally coded sample due to the sequential generation of bits. Successive approximation ADCs have been designed to operate on a fixed frequency clock, with the bit determination requiring the longest time being less than or equal to a clock cycle in duration. However, since not all bit determinations require the same amount of time, some time is wasted in a multibit successive approximation conversion. With the successive approximation ADCs clock cycle duration based on the worst-case bit determination time, all bit determinations, other than possibly the worst-case bit determination, wastes a portion of a clock cycle by completing the determination of a bit in less than the clock period allocated for that bit determination.

What is needed is a technique to improve the speed of conversion of a successive approximation ADC such as by providing a signal to drive the successive approximation bit determination based on the time required for each bit determination and not a predetermined duration of time allocated for each bit determination.

SUMMARY OF THE INVENTION

In accordance with an illustrative embodiment of the invention, an integrated circuit includes a successive approximation analog-to-digital converter. The successive approximation analog-to-digital converter employs comparators having oppositely coupled inputs and logic circuitry to generate a signal upon a bit determination, with the signal latching the determined bit, resetting the comparators for the subsequent bit determination, and when a subsequent bit is yet to be determined commencing the subsequent bit determination.

DETAILED DESCRIPTION

Figure 1:
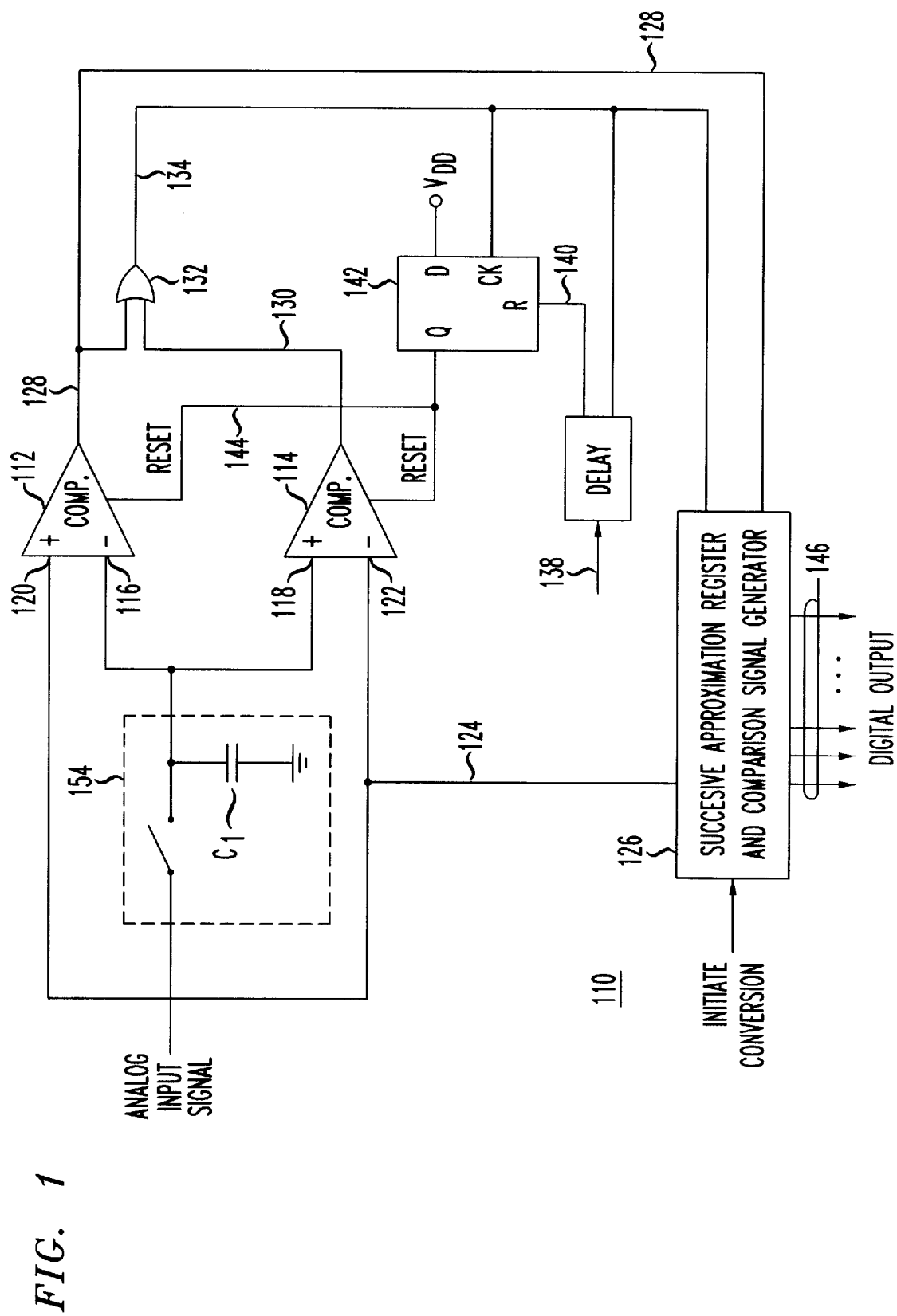
FIG. 1 is a schematic diagram of a successive approximation analog-to-digital converter in accordance with the present invention.

A schematic diagram of a successive approximation analog-to-digital converter 110 in accordance with the present invention is shown in FIG. 1. Converter 110 is provided a sample of an analog signal to convert to a digital representation, and the conversion process is initiated. Converter 110 is not clocked by an external clock but develops a signal that latches a bit at the conclusion of each bit determination, and sets the conditions to generate another signal to latch the subsequent bit determined in the next subsequent bit determination. When all bits are determined to the bit depth converter 110 is operating, a new sampled analog signal is stored and the conversion process is repeated to convert the next analog sample to a digital representation.

Converter 110 is a multibit analog-to-digital converter for converting a sample of an analog signal to a multibit digitally encoded representation of a predetermined number of bits. The digital representation may be of any known convention, for example, binary, two's complement, or sign magnitude. Converter 110 includes a sample-and-hold circuit 154 including capacitor C1 on which a sample of an analog signal to be converted is maintained. The remainder of the sample-and-hold circuit may be of any known form and therefore is not shown. Capacitor C1 maintains the voltage developed thereon as the sampled analog signal being converted and provides the sampled analog signal as an input to each of oppositely coupled comparators 112 and 114. For example, one side of capacitor C1 may be coupled to the negative input 116 of comparator 112 and the positive input 118 of comparator 114. The positive input 120 of comparator 112 and the negative input 122 of comparator 114 are commoned to receive as a comparison signal an output 124 from successive approximation register and comparison signal generator 126. Output 128 from comparator 112 and output 130 from comparator 114 are provided as inputs to OR gate 132. Output 128 from comparator 112 is also provided as an input to successive approximation register and comparison signal generator 126. OR gate 132 provides an output 134 that is provided to successive approximation register and comparison signal generator 126 and also is provided as an input to delay circuit 136.

Delay circuit 136 provides an output 140 to reset flip-flop 142 and may receive a selector input 138 to control the duration of the delay. Upon being reset, flip-flop 142 provides an output 144 to reset comparators 112 and 114 each to a known output state. The known state to which comparators 112 and 114 are reset need not be identical.

In operation, capacitor C1 is a portion of a sample-and-hold circuit that holds a sample of an analog signal that is to be converted to a digital form. With capacitor C1 charged, a sample of an analog signal is applied to comparators 112 and 114 having inputs of oppositely coupled polarity. While the illustrative embodiment shows the sampled analog input provided to input 116 of comparator 112 and input 118 of comparator 114, the invention is not limited thereto.

Comparators 112 and 114 are high input impedance comparators so as not to alter the sampled analog signal maintained on capacitor C1. Comparators 112 and 114 are offset matched to within a voltage represented by one-half of the least significant bit that is to be determined by analog-to-digital converter 110. Reset signal 144 resets both comparators by forcing the output state of each of comparators 112 and 114 to a known one of the possible output states, such as a logic zero or logic one. For example, a logic high output 144 from reset flip-flop 142 may reset comparators 112 and 114 to both have outputs, respectively 128 and 130, that are a logic zero.

For each bit determination, successive approximation register and comparison signal generator 126 generates a voltage, provided at output 124, to which the sampled analog voltage is compared. For example, in a single ended digital-to-analog converter, the voltage provided as output 124 may start at the midpoint of the potential range of voltages the sampled analog signal could potentially take on. The voltage provided at output 124 is generated in any known manner. Output 124 from successive approximation register and comparison signal generator 126 is provided to comparator 112 as input 120 and is provided to comparator 114 as input 122.

With a sampled analog signal applied to a first input and a comparison voltage applied to a second input of each of comparators 112 and 114, the output of one of comparators 112 and 114 transitions to or remains at a logic one. In the illustrated embodiment, the output 128 of comparator 112 transitions to or remains at a logic one when the comparison voltage provided as output 124 from successive approximation register and comparison signal generator 126 provided to comparator 112 as input 120 is greater than the sampled analog signal provided as input 116 to comparator 112. The output 128 of comparator 112 transitions to or remains at a logic zero when the comparison voltage provided as output 124 from successive approximation register and comparison signal generator 126 provided to comparator 112 as input 120 is less than the sampled analog signal provided as input 116 to comparator 112.

The output 130 of comparator 114 transitions to or remains at a logic zero when the comparison voltage provided as output 124 from successive approximation register and comparison signal generator 126 provided to comparator 114 as input 122 is greater than the sampled analog signal provided as input 118 to comparator 114. The output 130 of comparator 114 transitions to or remains at a logic one when the comparison voltage provided as output 124 from successive approximation register and comparison signal generator 126 provided to comparator 114 as input 122 is less than the sampled analog signal provided as input 118 to comparator 114.

Upon comparing the sampled analog signal to the comparison voltage, the output of one of comparators 112 and 114 will transition out of the known state, such as to a logic one. The transition to a logic one also causes the output of OR gate 132 to transition to a logic one.

The output of at lease one of comparators 112 and 114, in the FIG. 1 embodiment the output of comparator 112, is provided to successive approximation register and comparison signal generator 126 as the determined bit, and the output 134 of OR gate 132 is provided to successive approximation register and comparison signal generator 126 to latch the determined bit into the next available bit position of the successive approximation register.

The output 134 from OR gate 132 is also provided to delay 136 and the clock input of flip-flop 142. Upon flip-flop 142 clock input transitioning states, a logic high is shifted from the D input coupled to $V_{DD}$ to the Q output. The output of flip-flop 142 transitioning from one state to another resets comparators 112 and 114 to have outputs of a known state as described above, setting-up the conditions for the next iteration or bit determination.

In delay 136, output 134 initiates a predetermined delay until output 140 transitions to reset flip-flop 142. The duration of the delay is preset by selector 138 and may be controlled by varying selector 138, as is known in the art. Resetting flip-flop 142 removes the logic high from output Q until the clock input subsequently transitions from one logic state to another. Resetting slip-flop 142 removes the reset signal from comparators 112 and 114. The duration of delay 136 is selected to assure the comparators reset to a known state as described above and may range to as low as no delay.

Upon receipt of a determined bit, a new comparison signal is generated by the successive approximation register and comparison signal generator 126 while flip-flop 142 resets comparators 112 and 114. The above-described process continues iteratively to determine a number of bits to the depth of the successive approximation register. When all of the bits to the depth of the successive approximation register have been determined, the digital representation of the sampled analog signal is available as digital output 146 and a new sample of the analog signal is placed on capacitor C1 by sample-and-hold circuit 154 and maintained for conversion to a corresponding digital representation.

Figure 2:
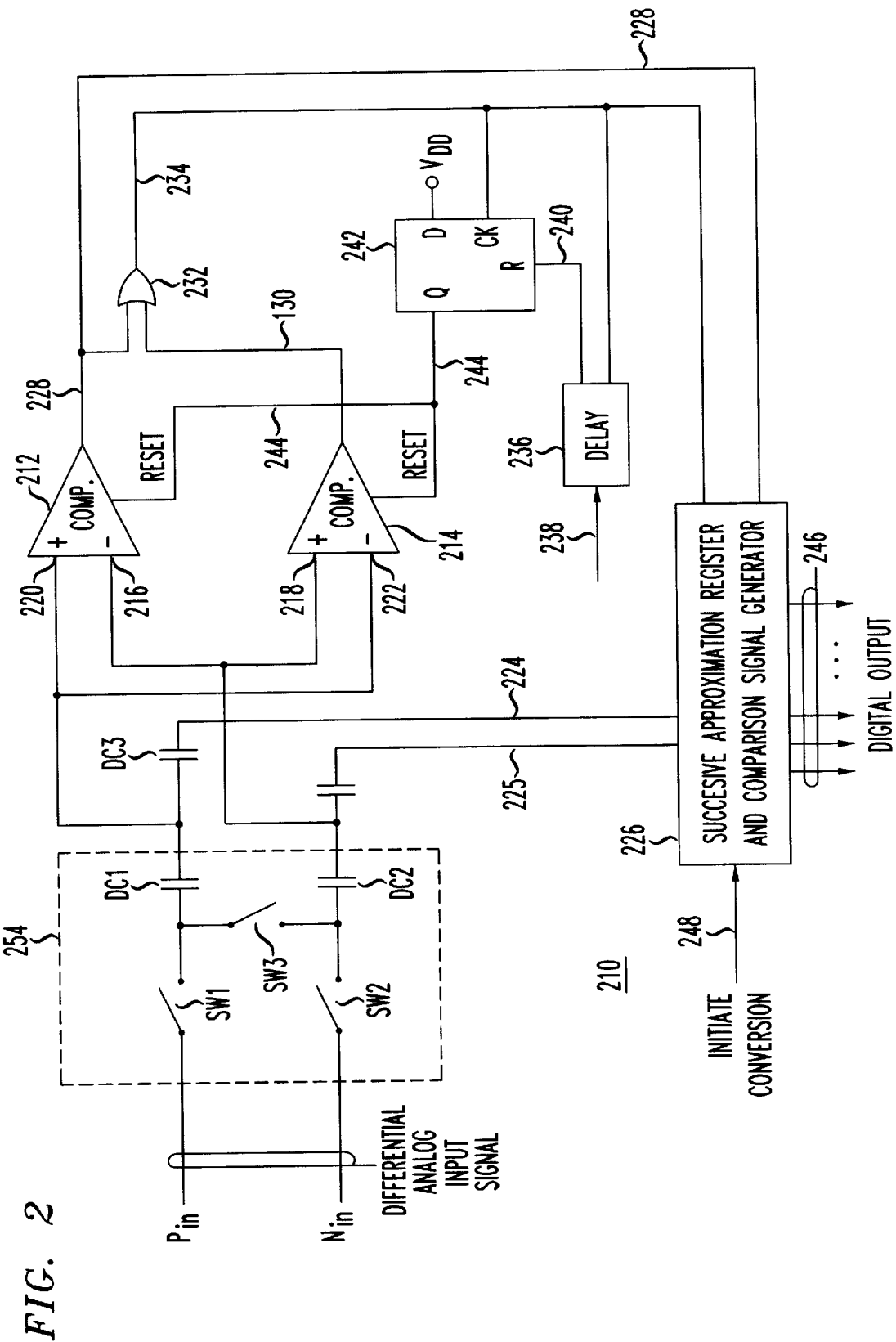
FIG. 2 is a schematic diagram of an alternate embodiment successive approximation analog-to-digital converter illustrating a fully differential converter in accordance with the present invention.

FIG. 2 illustrates an alternate embodiment of the present invention. Converter 210 is a multibit analog-to-digital converter for converting a sample of a differential analog signal to a multibit digitally encoded representation of a predetermined number of bits. The digital representation may be of any known convention, for example, binary, two's complement, or sign magnitude. Converter 210 includes a sample-and-hold circuit 254 including capacitors DC1, DC2, DC3, and DC4, as well as switches SW1, SW2 and SW3. Switches may be implemented in any known manner, such as solid state switches.

A differential analog signal is provided to nodes $P_{in}$ and $N_{in}$. With switch SW3 opened and switches SW1 and SW2 closed, a sample of the differential analog signal is stored on capacitors DC1 and DC2. Switches SW1 and SW2 open to isolate nodes $P_{in}$ and $N_{in}$, respectively. Subsequently switch SW3 closes establishing a common mode sampled analog signal on capacitors DC1 and DC2. Successive approximation register and comparison signal generator 226 upon the presence of initiate conversion signal 248 generates differential comparison signals 224 and 225 which are applied to capacitors DC3 and DC4. The common point between capacitors DC1 and DC3 is provided as an input to each of oppositely coupled comparators 212 and 214, such as the positive input of comparator 212 and the negative input of comparator 214. The common point between capacitors DC2 and DC4 is provided as another input to each of comparators 212 and 214, such as to the negative input 216 of comparator 212 and the positive input 218 of comparator 214. In operation, converter 210 operates in the manner of converter 110 described above to generate digital output 246.

The technique of the present invention is fast for a successive approximation analog-to-digital converter as it provides a sufficient duration of time for analog-to-digital converter 110 to determine a bit, perhaps with a small margin, introduced by delay 136 thereby reducing the wasted time between bit determinations that a predetermined clock period necessitates. As soon as a comparator makes transition from a known state at reset to another known state, a determination of the output bit for that iteration in the multibit conversion, the comparator output is provided to successive approximation register and comparison signal generator 126 for storage and the successive approximation analog-to-digital converter employing the present technique proceeds to determine the next subsequent bit, if there is one in the bit depth being determined.

While the invention has been illustrated in FIG. 1 using an analog-to-digital converter that is single ended, one skilled in the art could employ the teachings of this invention in differential circuits as illustrated in FIG. 2, as well as complimentary circuits. The invention is particularly useful in communications systems and equipment employing integrated circuits in analog-to-digital applications where speed of conversion is of concern. The converter may be a stand-alone converter or may be a portion of an integrated circuit, such as a microprocessor, microcontroller, digital signal processor codec, radio, or other mixed signal integrated circuit.

What is claimed is:

1. A method of converting an analog signal to a multibit digital representation, comprising the steps of:

(a) sampling an analog signal to provide a sampled analog signal;

(b) initiating conversion of the sampled analog signal;

(c) generating a comparison signal;

(d) comparing the sampled analog signal to the comparison signal to generate a determined bit; and (e) generating a signal based on the determined bit to store the determined bit.

2. A method as recited in claim 1, further comprising the steps of:

employing the signal based on the determined bit to initiate a subsequent bit determination; and repeating steps (c) through (e).

3. A method as recited in claim 2, further comprising the step of introducing a delay of predetermined duration prior to initiating a subsequent bit determination.

4. An analog-to-digital converter, comprising:

a first comparator adapted to receive a sample of an analog signal as a first input at a port of a first polarity, a comparison signal as a second input at a port of a second polarity, the first comparator adapted to compare the first and second inputs and provide a first comparator output signal;

a second comparator adapted to receive the sample of an analog signal as a first input at a port of the second polarity, and the comparison signal as a second input at a port of the first polarity, the second comparator adapted to compare the first and second inputs and provide second comparator output signal;

a first logic circuit for receiving the first and second comparator outputs as inputs and for combining the first and second comparator outputs to provide a first logic circuit output that takes on one of a predetermined number of states;

a register and comparison signal generator adapted to receive the first logic circuit output and at least one of the first and second comparator output signals, the register and comparison signal generator adapted to store as a determined bit the at least one comparator output signal, the register and comparison signal generator providing the comparison signal;

a delay circuit for receiving the first logic circuit output as an input and for providing an output at a predetermined delayed interval; and a second logic circuit for receiving as inputs the first logic circuit output and the delay circuit output, the second logic circuit adapted to transition to a predetermined logic state when the first logic circuit output is present and the delay circuit output is applied, the second logic circuit providing as an output, a reset signal to at least one of the first and second comparators.

5. A converter as recited in claim 5, wherein the first logic circuit is a logic gate.

6. A converter as recited in claim 5, wherein the logic gate is an OR gate.

7. A converter as recited in claim 4, wherein the second logic circuit is a flip-flop.

8. A converter as recited in claim 4, wherein the delay circuit further comprises a selector for presetting/predetermining the duration of a delay introduced by the delay circuit.

9. A converter as recited in claim 4, wherein the converter is fabricated in an integrated circuit.

10. A converter as recited in claim 9, wherein the integrated circuit is a microcontroller, microprocessor, or digital signal processor.

11. A converter as recited in claim 4, wherein the reset signal is applied to both the first and second comparators.

12. A converter as recited in claim 4, further comprising a sample-and-hold circuit for receiving the analog signal and generating the sample thereof.

13. A converter as recited in claim 12, wherein the sample-and-hold circuit is adapted to.

* * * * *